United States Patent
Cho et al.

(10) Patent No.: US 8,389,388 B2
(45) Date of Patent: Mar. 5, 2013

(54) PHOTONIC DEVICE AND METHOD OF MAKING THE SAME

(75) Inventors: Hans S. Cho, Palo Alto, CA (US); Theodore I. Kamins, Palo Alto, CA (US); Nathaniel J. Quitoriano, Pacifica, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1 day.

(21) Appl. No.: 13/258,404

(22) PCT Filed: Apr. 30, 2009

(86) PCT No.: PCT/US2009/042403
§ 371 (c)(1),
(2), (4) Date: Sep. 21, 2011

(87) PCT Pub. No.: WO2010/126519
PCT Pub. Date: Nov. 4, 2010

(65) Prior Publication Data
US 2012/0032168 A1    Feb. 9, 2012

(51) Int. Cl.
*H01L 21/20* (2006.01)
(52) U.S. Cl. .......... 438/487; 257/E31.043; 257/E31.047
(58) Field of Classification Search ........... 257/E31.043, 257/E31.124, E31.047, E31.033; 438/71, 438/487, 488, 96, 482, 486; 136/258, 249, 136/255, 261; *H01L 31/0368, 31/18, 31/20, H01L 31/0296*
See application file for complete search history.

(56) References Cited

U.S. PATENT DOCUMENTS

| | | | |
|---|---|---|---|
| 4,431,858 | A | 2/1984 | Gonzalez et al. |
| 6,184,456 | B1 | 2/2001 | Matsuyama et al. |

(Continued)

FOREIGN PATENT DOCUMENTS

| | | |
|---|---|---|
| JP | 1994-188307 | 7/1994 |
| JP | 2004-103611 | 4/2004 |

(Continued)

OTHER PUBLICATIONS

Harder, N.-P.; Neuhaus, D.-H.; Altermatt, P.P.; , "Discussion of recombination current mechanisms at grain boundaries in the bulk: a simplified model," Photovoltaic Specialists Conference, 2005. Conference Record of the Thirty-first IEEE , vol., no., pp. 491-494, Jan. 3-7, 2005.*

(Continued)

*Primary Examiner* — N Drew Richards
*Assistant Examiner* — Christina Sylvia

(57) ABSTRACT

A photonic device (200) and method (100) of making the photonic device (200) employs preferential etching of grain boundaries of a polycrystalline semiconductor material layer (210). The method (100) includes growing (110) the polycrystalline layer (210) on a substrate (201). The polycrystalline layer includes a transition region (212) of variously oriented grains and a region (214) of columnar grain boundaries (215) adjacent to the transition region. The method further includes preferentially etching (120) the columnar grain boundaries to provide tapered structures (220) of the semiconductor material that are continuous (217) with respective aligned grains (213) of the transition region. The tapered structures are predominantly single crystal. The method further includes forming (140) a conformal semiconductor junction (240) on the tapered structures and providing (160) first and second electrodes. The first electrode (201, 262) is adjacent to the transition region and the second electrode (260) is adjacent to a surface layer of the conformal semiconductor junction.

15 Claims, 5 Drawing Sheets

U.S. PATENT DOCUMENTS

| | | |
|---|---|---|
| 7,276,389 B2 | 10/2007 | Kim et al. |
| 2002/0132101 A1 | 9/2002 | Fonash et al. |
| 2003/0132437 A1 | 7/2003 | Yamaguchi et al. |
| 2004/0084407 A1 | 5/2004 | Makarov et al. |
| 2004/0113228 A1 | 6/2004 | Yamada et al. |
| 2005/0006673 A1 | 1/2005 | Samuelson et al. |
| 2007/0102721 A1 | 5/2007 | DenBaars et al. |
| 2007/0137697 A1 | 6/2007 | Kempa et al. |
| 2008/0006319 A1 | 1/2008 | Bettge et al. |
| 2008/0087998 A1 | 4/2008 | Kamins et al. |

FOREIGN PATENT DOCUMENTS

| | | |
|---|---|---|
| KR | 10-19980065744 | 10/1998 |

OTHER PUBLICATIONS

F. N. Gonzalez et al., "Design of Quasi-Grain-Boundary-Free (QGBF) Polycrystalline Solar Cells", IEEE Electron Device Letters, vol. EEL-2, pp. 141-143 (Jun. 1981).*

Sharma, K.; Joshi, D.P.; Bhatt, D.P.;, "Grain boundary recombination and efficiency of polycrystalline silicon solar cells," Emerging Trends in Electronic and Photonic Devices & Systems, 2009. ELECTRO '09. International Conference on, vol., no., pp. 511-513, Dec. 22-24, 2009.*

Czaban, Josef et al., GaAs Core Shell Nanowires for Photovoltaic Applications, Nano Lett., 2009, pp. 148-154, vol. 9, No. 1.

Kayes, B. M. et al., Radial PN Junction, Wire Array Solar Cells, Conference Record of the Thirty-third IEEE Photovoltaic Specialists Conference, 2008, 5 pages.

Linyou Cao et al., Diamond-Hexagonal Semiconductor Nanocones with Controllable Apex Angle, J. Am. Chem. Soc., 2005, pp. 13782-13783, Vol. 127, No. 40.

Kamins, T. I. et al., Growth and Structure of Chemically Vapor Deposited Ge Nanowires on Si Substrates, Nano Lett., 2004, pp. 503-506, vol. 4, No. 3.

Tao, Meng, Inorganic Photovoltaic Solar Cells: Silicon and Beyond, The Electrochemical Society Interface, Winter 2008, pp. 30-35.

Sharma, S. et al., Diameter control of Ti-catalyzed silicon nanowires, Journal of Crystal Growth, 2004, pp. 613-618, vol./No. 267.

Kelzenberg, Michael D. et al., Photovoltaic Measurements in Single-Nanowire Silicon Solar Cells, Nano Lett., 2008, pp. 710-714, vol. 8, No. 2.

Tian, Bozhi et al., Coaxial silicon nanowires as solar cells and nanoelectronic power sources, Nature (Letters), Oct. 18, 2007, pp. 885-890, vol. 449.

Goncher, G. et al., p-n Junctions in Silicon Nanowires, Journal of Electronic Materials, 2006, pp. 1509-1512, vol. 35, No. 7.

* cited by examiner

PHOTONIC DEVICE AND METHOD OF MAKING THE SAME

CROSS-REFERENCE TO RELATED APPLICATIONS

N/A

STATEMENT REGARDING FEDERALLY SPONSORED RESEARCH OR DEVELOPMENT

N/A

BACKGROUND

High performance semiconductor devices, especially those with p-n junctions, are historically made with single crystal semiconductor materials. The use of such single crystal materials for semiconductor devices effectively avoids charged carrier scattering and minority carrier recombination when compared to using non-single crystal semiconductor materials that have grain boundaries. The scattering of charge carriers adversely reduces the drift mobility and the diffusion of the charged carriers, which leads to degraded performance of devices, such as photonic devices. Degraded performance is manifested by increased resistance and a decrease in optical to electrical conversion efficiency, for example. Even when different semiconductor materials were employed together in a semiconductor device, such as in a heterostructure or heterojunction device, single crystal semiconductor materials are generally chosen based on their respective lattice structures. This is to insure that the realized structure is effectively a single crystal structure as a whole. Similarly, nanostructures including, but not limited to, nanowires and nanodots are typically nucleated and grown from single crystal substrates, in part to capitalize on the uniform nature of the lattice of such substrates that provides required crystallographic information for the nanostructures to be aligned.

Photovoltaic cells are one type of photonic device that are the subject of much interest due to high energy costs and U.S. dependence on fossil fuel from foreign sources. Photodetectors are another type of photonic device of particular interest. The efficiency and quality of photovoltaic cells have improved significantly over the last 10 years. Efforts to lower the cost of photovoltaic cells have been directed at alternative materials and manufacturing methods.

Amorphous and other non-single crystal semiconductor materials, such as polycrystalline semiconductor materials, have attracted attention at least for potential cost savings in photovoltaic applications. While having the disadvantage of lower efficiencies that is associated with multiple grain boundaries in the non-single crystal semiconductor materials, such materials can be considerably cheaper to manufacture than their single crystal counterparts. There are applications where the lower cost of producing the semiconductor device from non-single crystal materials may outweigh any loss of performance that may result. However, this trade-off is simply not an option for many photonic applications.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
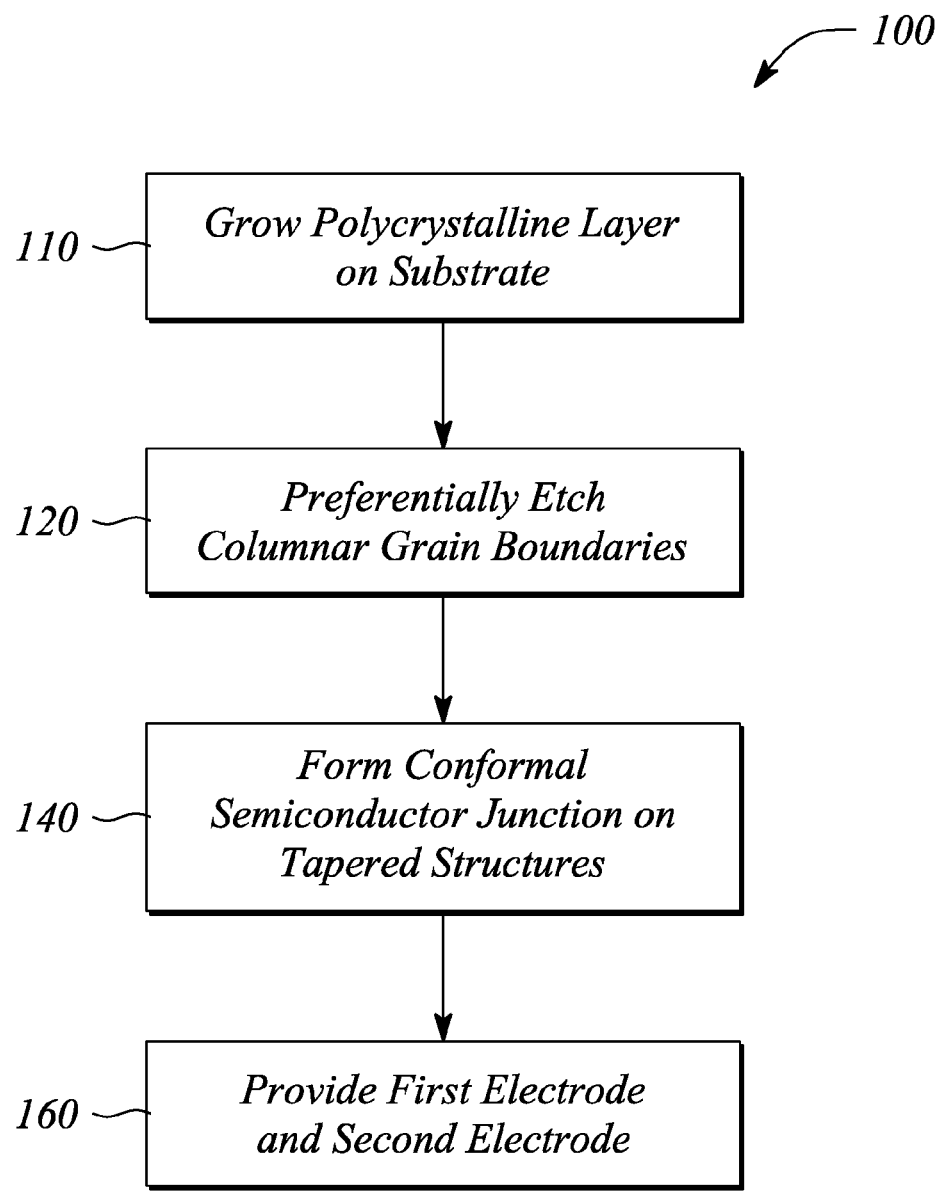
FIG. 1 illustrates a flow chart of a method of fabricating a photonic device, according to an embodiment of the present invention.

Embodiments of the present invention employ a light-absorbing semiconductor material with a high degree of crystallinity that can be fabricated on large area substrates for photonic devices, such as photodetectors and photovoltaic (i.e., solar) cells. In some embodiments, such photonic devices provide solar energy conversion efficiency comparable to single crystal semiconductor devices but at a lower cost.

Some embodiments of the present invention provide a method of fabricating a photonic device and a photonic device that employ single grains of a polycrystalline semiconductor film in an active region of the photonic device. In particular, a thick polycrystalline layer is formed on a substrate, for example a large area amorphous substrate. The thick polycrystalline layer has a transition region adjacent to the substrate and a columnar region on the transition region. The transition region comprises small grains and grain boundaries that are oriented in a variety of directions. The columnar region comprises relatively larger grains separated by grain boundaries that have a relatively uniform columnar alignment. Moreover, the columnar grains are continuous with certain grains of the transition region. The method preferentially etches grain boundaries in a columnar region of the thick polycrystalline layer down to the transition region to form a plurality of distinct tapered structures. The plurality of tapered structures has a variety of sizes and retains the relatively uniform alignment. Moreover, the tapered structures are continuous with respective grains in the transition region of the polycrystalline layer.

The tapered structures of the plurality are predominantly single crystal (i.e., a single grain). By 'predominantly single crystal,' it is meant that a tapered structure of the plurality may be either a single grain throughout or may further comprise a minor or negligible grain boundary in that the grain boundary has a small adverse affect on an active region of the tapered structure. The tapered structures have wide bases and relatively narrow top ends; the wide base provides less contact resistance in the photonic device. Moreover, the tapered structures of the plurality provide greater surface area for an active region and potentially greater light trapping ability.

The method further forms an active region comprising a semiconductor junction that conforms to an undulating surface of tapered structures of the plurality. In particular, the semiconductor junction conforms to the surface of each tapered structure. An optically transparent top electrode is provided in electrical contact with a surface region of the conformal semiconductor junction. A bottom electrode is in electrical contact with the transition region of the polycrystalline film. In some embodiments, the conformal semiconductor junction at the surface of the tapered structures may facilitate more light absorption by the photonic device. In some embodiments, the undulating tapered structures provide more light trapping properties between the tapered structures. The method of fabrication is particularly suited for making photonic devices on large area, non-single crystal substrates and is compatible with current semiconductor fabrication techniques. For example, the method does not introduce metal impurities (e.g., such as from metal-catalyzed growth techniques) into the active region of the tapered structures.

Other embodiments of the present invention provide a method of fabricating a photonic device and a photonic device that employ single crystal wire structures having a tapered shape, and in some embodiments, a non-uniform alignment on a substrate. In particular, the single crystal wire structures are grown from a non-single crystal surface of a substrate using a combination of metal-catalyzed growth and non-catalyzed growth. During growth of the wire structures, parameters are manipulated to achieve a tapered shape that provides a wider base to decrease contact resistance of the photonic device and a relatively narrow top. In some embodiments, the non-uniform alignment of wire structures may provide anti-reflection properties to the photonic device. Moreover, the tapered shape of the single crystal wire structures provide greater surface area for an active region and also may improve light trapping ability. This is due to an overall undulating surface formed by the tapered wire structures and in some embodiments, by the non-uniform alignment of the tapered wire structures. This method of fabrication which uses combined growth techniques to form tapered single crystal wire structures is also particularly suited for making photonic devices on large area, non-single crystal substrates including, but not limited to, glass.

A 'tapered structure' is defined as either a single-crystal semiconductor structure or a predominantly single crystal semiconductor structure, as defined above, having an axial length as a major dimension, opposite ends and a solid core. The base end of the tapered structure is continuous with and therefore, integrally attached or anchored to, a grain in a transition region of a polycrystalline semiconductor layer. Moreover, the tapered structure may be several microns or more (e.g., several tens of microns) in axial length. In some embodiments, the slope of the tapered structure is relatively uniform along its axial length (i.e., has a single taper angle from base to top); the structure being wide at its base and narrower at its top. In various embodiments herein, the slope (or taper) of the tapered structure can be generally defined as the ratio between its axial length (height) and one half of the change in width over the length of the segment or structure. The top of the tapered structure may comprise one or more of a point, curve, plateau and ridge, for example. The tapered structure may be one or more of conical, an asymmetrical cone shape, pyramidal, an asymmetrical pyramid shape and other polyhedral shapes, depending on the embodiment. In cross section, the tapered structure is one of circular, elliptical and polygonal and combinations of these shapes. In some embodiments, the tapered structure is formed from a columnar region of a thick polycrystalline layer using preferential etching of columnar grain boundaries in accordance with some embodiments of the method of making a photonic device described above. In various embodiments of the present invention, the tapered structures generally possess a height to base width ratio that is large, for example 2:1 or larger. In some embodiments, the ratio of height to base width may be 20:1 or larger.

A 'wire structure' is an individual, quasi-one dimensional single crystal semiconductor structure characterized as having two spatial dimensions or directions that are much less than a third spatial dimension or direction (i.e., length or height). The presence of the third, greater dimension in the wire structure facilitates conduction along that dimension while conduction may be quantized in the other two spatial dimensions. As used herein, the term 'tapered wire structure' or 'tapered wire' is defined as the wire structure, as described above, having an axial length (as a major or third spatial dimension), opposite ends, a solid core and a tapered shape along its axial length, which is wider at its base than at its top. The tapered shape may be uniform or non-uniform along the axial length of the wire structure. In some embodiments, the tapered wire structure may comprise one or more taper angles along its axial length. In cross section, the tapered wire is one of circular, elliptical and polygonal and combinations of these shapes. Moreover, the tapered wire structure may be several microns or even several tens of microns in axial length. The tapered wire structure is grown using a combination of catalyzed and non-catalyzed growth mechanisms to render the wire structure anchored at its wider base end to a non-single crystal substrate surface in accordance with other embodiments of the method of making a photonic device described above. The top of the tapered wire structure comprises a nanoparticle catalyst during growth.

The terms 'tapered structure' and 'tapered wire' may be used interchangeably herein as 'tapered structure' for describing the structure with which the active region of the photonic device is formed. It should be understood that the terms 'tapered structure' and the 'tapered wire,' as used herein, correspond to different methods of their formation according to various embodiments of the method of making a photonic device of the present invention. As such, a tapered wire is always single crystal while the tapered structure is predominantly single crystal, as defined above. The methods of making herein produce photonic devices having some different characteristics including, but not limited to, an active region that is either non-uniformly aligned or uniformly aligned. As such, the photonic devices made by the methods described herein have a variety of advantages, at least some of which may improve the efficiency of the photonic devices.

For the various embodiments, the substrate material may be any material that can withstand the processing temperatures and conditions of the respective methods of making a photonic device described herein. In some embodiments, the substrate material is one of a glass, a metal, a metal alloy, a ceramic, a plastic, a polymer, a dielectric and a semiconductor. In some embodiments, the substrate material may be any of rigid, semi-rigid or flexible. Moreover, the substrate may exhibit one or more of the following characteristics: thermally conductive, electrically conductive, refractive, reflective, opaque, and optically transparent, depending on the embodiment of the photonic device being made. A 'large area substrate' is a non-single crystalline substrate that is manufactured without expensive semiconductor wafer fabrication technology such that the substrate can be larger than current circular wafers that have a diameter of about 20 centimeters (cm) or even about 30 cm, for example. By 'non-single crystalline' or 'non-single crystal,' it is meant that the substrate material may be one or more of amorphous, microcrystalline and polycrystalline. For example, glass is an inexpensive, amorphous material that also provides optical transparency for some embodiments of the present invention. In some embodiments, the size of the large area substrate may be larger than that of flat screen television displays, for example. For simplicity herein, a 'substrate surface' may mean either a surface of a substrate or a seed layer of a material on a surface of the substrate, depending on the embodiment of the present invention.

The term 'extrinsic semiconductor' is defined as a semiconductor material that is intentionally doped with either a p-type dopant or an n-type dopant to provide a higher level of electrical conductivity to the semiconductor material than the semiconductor inherently has. The term 'extrinsic region' is a region of the extrinsic semiconductor. The term 'intrinsic semiconductor' is defined as a semiconductor material that is one or more of undoped, lightly doped, and not intentionally doped with a dopant material. The term 'intrinsic region' is a region of the intrinsic semiconductor. By 'lightly doped' and 'not intentionally doped' (or 'unintentionally doped'), it is meant that a relatively small amount of dopant may be incorporated in the intrinsic semiconductor, for example as a result of one or both of diffusion of dopants and unintentional doping from an adjacent extrinsic semiconductor. The relatively small amount of dopant is a very low concentration of dopant, for example approximately $10^{15}$ per cubic centimeter or less, relative to an extrinsically doped semiconductor, which may have $10^{17}$ per cubic centimeter of dopant or higher, for example.

According to the various embodiments herein, the photonic device comprises a conformal semiconductor junction. The term 'semiconductor junction' means one or more layers of materials or regions of the material layers that form one of a p-n junction, a p-i-n junction, and a Schottky junction as well as any combination of said junctions layered or stacked on top of one another to form a multilayer semiconductor or semiconductor-metal junction, for example. By 'conformal,' it is meant that the respective layer(s) of the junction conforms to the shape or topography of the tapered structure along the axial length of the tapered structure. In some embodiments, the conformal semiconductor junction also may be a coaxial semiconductor junction depending on the shape of the tapered structure. In some embodiments, the conformal semiconductor junction comprises a Schottky junction that may include a lightly doped semiconductor layer adjacent to a metal layer. In other embodiments, the conformal semiconductor junction comprises one or more p-n junctions and p-i-n junctions. The p-n junction and the p-i-n junction are provided by selective doping both the tapered structure and one or more conformal semiconductor junction layers on the tapered structure. Moreover, in some embodiments, the tapered wires may be selectively doped during growth to provide one or both axial and conformal semiconductor junction regions within the tapered wire.

For example, a conformal p-n semiconductor junction may comprise a tapered structure that is an extrinsic semiconductor region having a p-type dopant that is integral to a p-type doped grain of the transition region; and a conformal semiconductor layer on the tapered structure that is an extrinsic semiconductor region having an n-type dopant. In another example, a conformal p-i-n semiconductor junction may comprise the p-doped tapered structure as described above; a first conformal semiconductor layer on the tapered structure that is an intrinsic semiconductor region; and a second conformal semiconductor layer on the first conformal semiconductor layer that is an extrinsic semiconductor region having an n-type dopant. In another example of the conformal p-i-n semiconductor junction, the semiconductor junction may comprise the p-doped tapered structure as described above; a first conformal semiconductor layer on the tapered structure that is a heavily doped p+-type layer; a second conformal semiconductor layer that is an intrinsic semiconductor region; and a third conformal semiconductor layer on the second conformal semiconductor layer that is an extrinsic semiconductor region having an n-type dopant. In another example, a conformal Schottky semiconductor junction may comprise a tapered structure that is or comprises an intrinsic (i.e., lightly doped) region or moderately doped region having either a p-type dopant or n-type dopant; and a conformal conductive metal layer on the tapered structure adjacent to the region.

In some embodiments, the conformal semiconductor junction comprises an additional semiconductor layer directly on the tapered structure that has the same conductivity type as the tapered structure. The other layers of the respective conformal semiconductor junction are formed directly on this additional semiconductor layer. The additional semiconductor layer (having the same conductivity type as tapered structure) may move a depletion region of the semiconductor junction away from one or both of the tapered structure and an interface with the tapered structure, either of which may have crystal defects, for example. A crystal defect might detrimentally affect the efficiency of the semiconductor junction to generate charge carriers.

Moreover, the level of doping in each layer or structure may be the same or different, depending on the embodiment. The variation in dopant level may yield a dopant gradient, for example. In an example of differential doping, the surface to which the tapered structure is anchored (i.e., non-single crystal substrate surface or the transition region, depending on the embodiment) may be heavily doped to yield a p+ region relative to the p region of the tapered structure. The heavier doping provides a lower resistivity within the substrate surface. It should be noted that the dopant types may be reversed in any of the examples herein and still be within the scope of the embodiments.

The photonic device may comprise a heterostructure or a heterojunction, according to some embodiments. For example, semiconductor materials having differing band gaps may be employed to respectively realize the tapered structure and the conformal semiconductor layer(s) of the semiconductor junction. The photonic device that comprises such differing materials is termed a heterostructure photonic device. Further, according to some embodiments, the photonic device may be a hetero-crystalline photonic device. The term 'hetero-crystalline' is defined herein as a structure comprising at least two different types of structural phases. For example, a photonic device that comprises a microcrystalline substrate surface and a single crystal wire structure, according to some embodiments, is a hetero-crystalline photonic device.

The semiconductor materials used for the structures and layers of the photonic device, according to some embodiments, are independently selected from a semiconductor or a compound semiconductor composed of Group IV elements (e.g., Si, Ge, SiGe), a compound semiconductor composed of elements from Group III and Group V (e.g., GaAs, AlAs, AlGaAs), and a compound semiconductor composed of elements from Group II and Group VI (e.g., ZnO, CdS, CdSe). Therefore, the tapered structure may be the same as or a different semiconductor material as the conformal semiconductor junction. Moreover, the tapered wire may be the same as or a different semiconductor material from either of the conformal semiconductor junction or the substrate surface, depending on the embodiment. For example, the substrate may be glass, the substrate surface may be a microcrystalline silicon ('mc-Si') or an amorphous silicon ('a-Si') seed layer, the tapered wire may be gallium arsenide (GaAs) and the conformal semiconductor junction layer may comprise a single-crystal aluminum gallium arsenide (AlGaAs). In another example, the polycrystalline layer and therefore the tapered structures may be silicon, while the conformal semiconductor junction may comprise germanium (Ge).

In some embodiments, concomitant with a choice of the semiconductor materials independently used in the photonic device is a respective energy band gap of the respective materials. In some embodiments, the energy band gap of the tapered structure may be different from the energy band gap of the conformal semiconductor layer of the semiconductor junction (a heterojunction). Moreover, one or more different semiconductor materials with different energy band gaps may be used for the various extrinsic and intrinsic regions of the conformal semiconductor junction. In some embodiments, the energy band gap of the semiconductor substrate surface may be different from the energy band gap of the tapered nanowire (a heterostructure). In other embodiments, the energy band gaps of two or more of the respective semiconductor materials are the same.

The electrode material of the first and second electrodes is an electrically conductive material selected from a highly doped semiconductor, a metal, a metal alloy, a metal oxide. In some embodiments, the electrode material is also optically transparent or formed in such a thin layer that it is effectively optically transparent while retaining sufficient electrically conductivity for proper operation of the photonic device. In some embodiments, the electrode material may be a metal that includes, but is not limited to, gold, silver, platinum, palladium, tin, aluminum and copper. In some embodiments, the electrode material is a conductive oxide, which may or may not also be a semiconductor; the conductive oxide including, but is not limited to, indium tin oxide (ITO) and zinc oxide (ZnO), both of which are also optically transparent. In other embodiments, the electrode material is a silicide or a germanide that includes, but is not limited to, platinum silicide (PtSi) or platinum germanide (PtGe).

In a Schottky junction, the metal material of the metal-semiconductor junction has rectifying properties that are suitable for use as a diode, for example. Moreover, the metal material has charge transfer compatibility with the semiconductor material at the metal-semiconductor junction. In some embodiments, the metal material of the Schottky junction includes, but is not limited to, one or more of gold, platinum, palladium and aluminum. In addition, metal materials such as, one or more of silver, tin and copper may be used, depending on the semiconductor material of the Schottky junction.

The term 'optically transparent' is defined herein as being either transparent or semi-transparent to electromagnetic radiation, in whole or in part, in one or more of visible, UV and IR spectrums (e.g., the term includes a spectral band within one or more of these). Further, as used herein, the article 'a' is intended to have its ordinary meaning in the patent arts, namely 'one or more'. For example, 'a tapered structure' generally means one or more tapered structures and as such, 'the tapered structure' means 'the tapered structure(s)' herein. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation.

The use of brackets '[ ]' herein in conjunction with such numbers as '111' and '110' pertains to a direction or orientation of a crystal lattice and is intended to include a set of equivalent directions '< >' within its scope, for simplicity herein. The use of parenthesis '( )' herein with respect to such numbers as '111' and '110' pertains to a plane or a planar surface of a crystal lattice and is intended to include planes of equivalent symmetry '{ }' within its scope for simplicity herein. Such uses are intended to follow common crystallographic nomenclature known in the art.

In some embodiments of the present invention, a method of making a photonic device and a photonic device are provided. FIG. 1 illustrates a flow chart of a method 100 of making a photonic device according to an embodiment of the present invention. FIGS. 2A-2D illustrate magnified cross sectional views of a photonic device during fabrication in accordance with the method 100 of making, according to an embodiment of the present invention. FIG. 2E illustrates a magnified cross sectional view of a photonic device 200 fabricated according to the method 100 of making and FIGS. 2A-2D, according to some embodiments. The method 100 of making comprises growing 110 a polycrystalline layer of a semiconductor material on a substrate; the polycrystalline layer is sufficiently thick to provide both a transition region of small grains and a columnar region of relatively larger grains. The substrate may be a large area substrate, as defined above, which means the substrate size and material is not limited by wafer fabrication technology that is one or both of expensive and size-limiting.

Figure 2A:
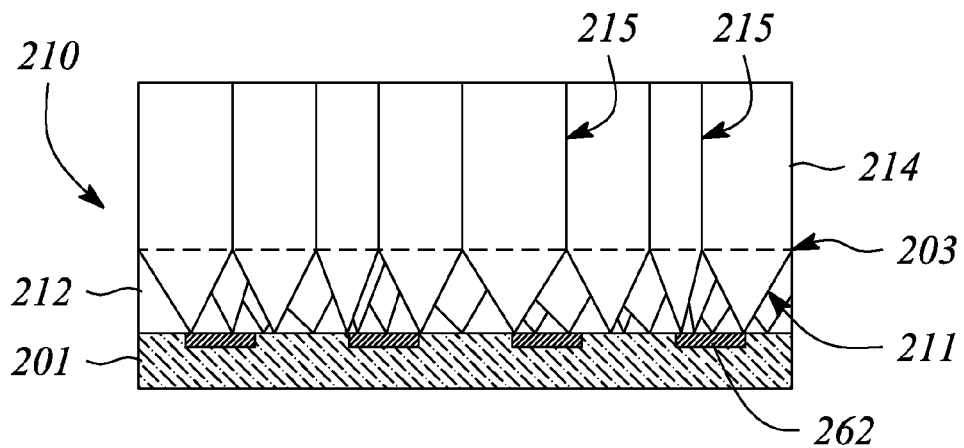
FIGS. 2A-2D illustrate cross sectional views of a portion of a photonic device being fabricated in accordance with the method of FIG. 1, according to an embodiment of the present invention.

FIG. 2A illustrates a cross sectional view of a polycrystalline layer 210 on a substrate 201. The polycrystalline layer 210 comprises a transition region 212 having a plurality of small grains that have a variety of orientations and grain boundaries 211. The transition region 212 is adjacent to the substrate 201. The polycrystalline layer 210 further comprises a columnar region 214 of a plurality of relatively larger grains that resembles adjacent columns (i.e., 'columnar grains') adjacent to the transition region 212. The columnar grains are delineated by grain boundaries 215 that extend relatively vertical (i.e., 'columnar grain boundaries') from the transition region 212. The larger-grained columnar region 214 is typically much thicker than the small-grained transition region 212. For example, the columnar region 214 may be at least twice as thick as the transition region.

In some embodiments, growing 110 a polycrystalline layer comprises using a chemical vapor deposition technique, for example, thermally activated chemical vapor deposition (CVD) or plasma enhanced chemical vapor deposition (PECVD). During growth, the grains of the polycrystalline material grow vertically and laterally on the substrate surface and compete for space. As such, the transition region has numerous grain orientations, sizes and boundaries. As growth progresses, some grains will grow faster than others. The grains that grow faster in the vertical direction form the columnar region, and slower-growing grains are occluded and are prevented from growing further. As such, the columnar region has grains that resemble columns with vertically extending grain boundaries (i.e., columnar) relative to the transition region. The grains of the columnar region originate from and are continuous with certain grains in the transition region.

In some embodiments, the columnar polycrystalline region may be formed by first depositing 110 an amorphous or polycrystalline thick precursor film, then annealing the precursor film by one or more of pulsed laser annealing, continuous wave laser annealing, rapid thermal annealing and furnace annealing, for example. In some embodiments, the thick precursor film may comprise an alloy of the semiconductor material and an impurity that has a tendency to segregate out of grains during grain growth or annealing. This results in impurity-rich columnar grain boundary regions that may be more susceptible to selective chemical or plasma etching at a later step, described below.

In some embodiments, the polycrystalline layer is grown to a thickness that is greater than 1 micron thick. In some embodiments, the thickness of the polycrystalline layer is greater than about 10 microns thick, for example, several tens of microns (e.g., 20 microns to 80 microns). In some embodiments, the polycrystalline layer is actually a polycrystalline wafer having a thickness similar to the thickness of a traditional single crystal semiconductor wafer, for example 200-800 microns thick. In some embodiments, the columnar region of the polycrystalline layer has a thickness that ranges from several microns to several tens of microns, depending on the thickness of the polycrystalline layer.

Figure 2B:
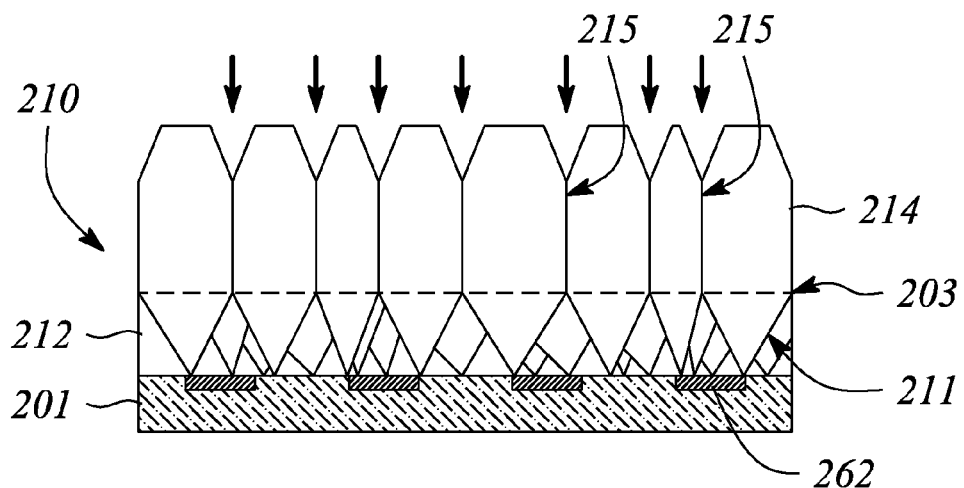
Figure 2C:
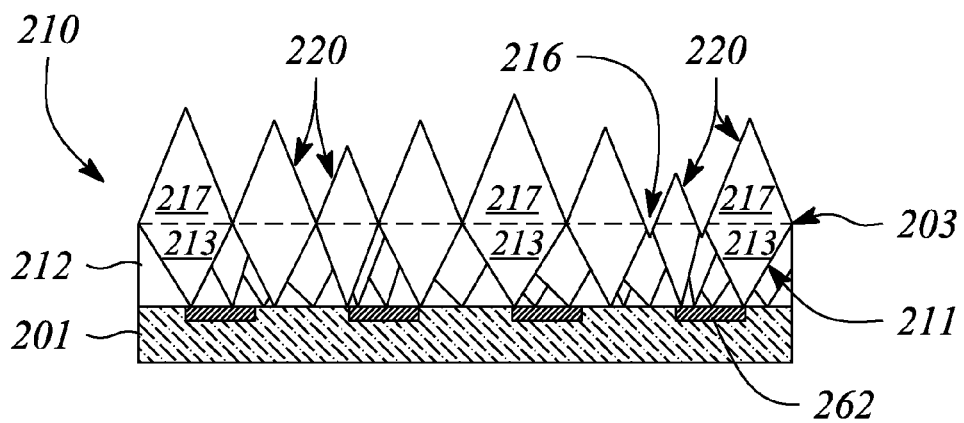

The method 100 of making further comprises preferentially etching 120 the columnar grain boundaries to provide a plurality of tapered structures of the semiconductor material. FIG. 2B illustrates a cross sectional view of the columnar region 214 during etching 120, by way of example; and FIG. 2C illustrates a cross sectional view of a plurality of tapered structures 220 after etching 120 the columnar grain boundaries 215. In some instances, the preferential etching 120 may follow a columnar grain boundary 215 into the transition region 212 (see ref. no. 216 in FIG. 2C by way of example). A dashed horizontal line 203 hypothetically delineates the regions 212, 214 in FIGS. 2A-2E for ease of illustration. Each tapered structure 220 is continuous with a certain grain 213 of the transition region 212 that is aligned with a grain 217 of the tapered structure 220. In some embodiments, the grain 217 of the tapered structure 220 is a single grain or the tapered structure is a single crystal. In some embodiments, the tapered structures are predominantly single crystal, as defined above. In some embodiments, the grain orientation of adjacent tapered structures may be different. In some embodiments, a tapered structure is continuous with one aligned grain 213 of the transition region 212. In some embodiments, a tapered structure may be continuous with at least one aligned grain 213 of the transition region 212. In some of these embodiments, the tapered structure contains a minor grain boundary. By 'minor grain boundary', it is meant that the grain boundary has a small affect on an active region that is subsequently formed on or in the tapered structure.

In some embodiments, preferential etching 120 the columnar grain boundaries comprises one or more of wet chemical etching, vapor chemical etching and plasma etching using a reactive species (e.g., reactive ions) that preferentially attacks grain boundaries. For example, the grain boundaries may be more susceptible to etching than an interior of the columnar grains because the grain boundaries have unfulfilled crystal bonds. As such, the preferential etching 120 etches the vicinity of the grain boundary faster than in the bulk of the grains. Physical bombardment (e.g., ion milling or sputtering) also may be used to remove material adjacent to grain boundaries more rapidly than material away from the grain boundaries. The preferential etching 120 results in tapered structures that are wider at a first or base end adjacent to the transition region than a second or top end opposite to the first end. This is because the top end is exposed to the etching process longer than the base end. As such, the plurality of tapered structures has a variety of sizes and relatively uniform vertical alignment. FIG. 2C illustrates a variety of heights and widths of the tapered structures 220 after etching 120 by way of example. Moreover, FIG. 2C illustrates that the tapered structures 220 have relatively pointed second ends, by way of example only. In some embodiments, the second ends may be curved, flat or include a ridge, for example. In some embodiments, a height of the tapered structures may range from about 1 micron to about several microns; in other embodiments, the tapered structures may range from several microns to 10 microns, or even several tens of microns, for example. In some embodiments, a width of the first end of the tapered structures (i.e., the base) may range from about 0.5 microns to about 1.5 microns or more, for example.

In other embodiments, a plurality of tapered structures may be produced by applying a mask having a dot-like pattern to the polycrystalline layer and then etching the polycrystalline layer anisotropically to form vias into the polycrystalline layer. The resultant etched structure would comprise a plurality of tapered structures that are similar to the plurality of tapered structures obtained by preferential etching 120 described above. For example, the pattern of dots may be formed using polystyrene beads; the beads being smaller than a grain size.

The method 100 of making further comprises forming 140 a conformal semiconductor junction on the plurality of tapered structures. The formed 140 conformal semiconductor junction conforms to a topography of the plurality of tapered structures and covers the axial length of the tapered structures, as defined above. In some embodiments, the formed 140 conformal semiconductor junction is also coaxial with the tapered structures. The conformal semiconductor junction is formed 140 comprising depositing a layer of a junction material on the plurality of tapered structures to conform to a surface of tapered structures. In some embodiments, the junction material layer is a metal to form a Schottky junction with the tapered structures; in some embodiments, the junction material layer may further comprise a semiconductor layer between the tapered structure and the metal layer. In other embodiments, the junction material layer is a semiconductor layer that is deposited on the tapered structures to form a conformal p-n junction with the tapered structures. In other embodiments, more than one semiconductor layers are deposited sequentially on the tapered structures to form a conformal p-i-n junction with the tapered structures. In some embodiments, the dopants for the respective conformal semiconductor layer of the junction are added during deposition or growth of the conformal layers. In some embodiments, the dopants for the conformal semiconductor junction are injected by diffusion from a solid, liquid, or vapor source in contact with the respective surface of one or both the tapered structures and the respective conformal semiconductor layer. In some embodiments, the dopants for the conformal semiconductor junction are injected by ion implantation doping of one or both of the tapered structures and respective conformal semiconductor layer.

In some embodiments, a depletion region of the semiconductor junction is moved away from one or both of the tapered structure and an interface with the tapered structure in case one or both of the tapered structure and the interface has defects. In some embodiments, the depletion region is moved by first depositing an initial semiconductor conformal layer on the tapered structure, wherein the initial semiconductor conformal layer may have the same conductivity type as the tapered structure. Then, for example, either another semiconductor layer comprising an opposite conductivity type or a metal layer is deposited on the initial semiconductor layer to form p-n junction or a Schottky junction, respectively, that is adjacent to, but not in the tapered structure or the interface. In the case of the Schottky junction, at least the initial semiconductor conformal layer is lightly doped (e.g., an intrinsic region) or at most, is moderately doped, for example. In another example, after the initial semiconductor layer of the same conductivity type as the tapered structures is deposited on the tapered structure, then each of an intrinsic semiconductor layer (i-region) and an n-doped semiconductor layer are grown on the initial semiconductor layer to form a p-i-n junction adjacent to, but not in the tapered structure and the interface.

In some embodiments, the tapered structures comprise an extrinsic first semiconductor material of a first conductivity or a first dopant type. Moreover, the transition region of the polycrystalline film comprises the extrinsic first semiconductor material of the same dopant type as the tapered structures. In some embodiments, the transition region may be more highly doped than the tapered structures. In some embodiments, the tapered structures either may be lightly doped or comprise an intrinsic region at the surface of the tapered structures. In some embodiments, depositing a conformal layer of a junction material (i.e., a semiconductor or a metal) comprises growing the layer on the surface of the tapered structures using a chemical vapor deposition technique, for example vapor phase epitaxy (VPE), molecular beam epitaxy (MBE), or plasma enhanced chemical vapor deposition (PECVD), such that an epitaxial connection with the tapered structure is formed. In some embodiments, the layer of semiconductor material comprises an extrinsic second semiconductor material of a second conductivity type (or a second dopant type) that is opposite or the reverse of the first conductivity type. For example, the tapered structures may comprise a p-type dopant; the transition region may be p+-type dopant, while the deposited junction layer of the conformal semiconductor junction comprises a semiconductor layer doped with an n-type dopant to form a p-n junction.

In some embodiments, the first semiconductor material (i.e., of the tapered structures and transition region) and the second semiconductor material (i.e., of the deposited junction layer) may be the same, while the degree of crystallinity may be the same or different. For example, the tapered structures may be predominantly single grains formed from a polycrystalline silicon layer, while the deposited semiconductor layer of the conformal semiconductor junction may extend the crystal structure of the underlying silicon grain. In another example, the first semiconductor material (i.e., of the tapered structures and transition region) and the second semiconductor material (i.e., of the deposited junction layer) may be the same, while the first semiconductor material is single-crystalline or polycrystalline (e.g., polycrystalline silicon) and the second semiconductor material is amorphous (e.g., amorphous silicon). In this example, the amorphous material (i.e., the amorphous silicon) has a different bandgap than polycrystalline material (i.e., the polycrystalline silicon). In another example, one of the semiconductor materials may be germanium while the other is silicon.

The respective dopants of the extrinsic semiconductor layers may be introduced into the layers during the formation of the polycrystalline layer and the deposition of the semiconductor layer of the conformal semiconductor junction. Alternatively, the respective dopants may be introduced after each of the polycrystalline layer and the conformal semiconductor junction layer is formed, for example using diffusion or ion implantation. It should be noted that use of the term 'extrinsic semiconductor material' is not intended to be a limitation as to when a dopant is introduced into the respective semiconductor material.

Figure 2D:
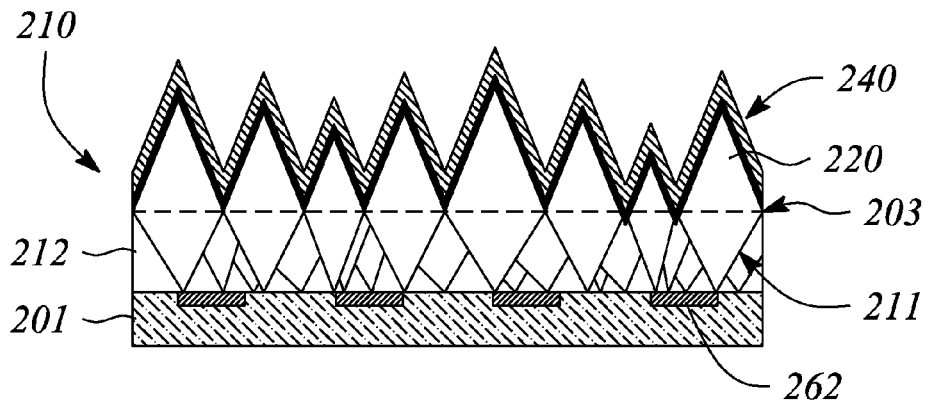
Figure 2E:
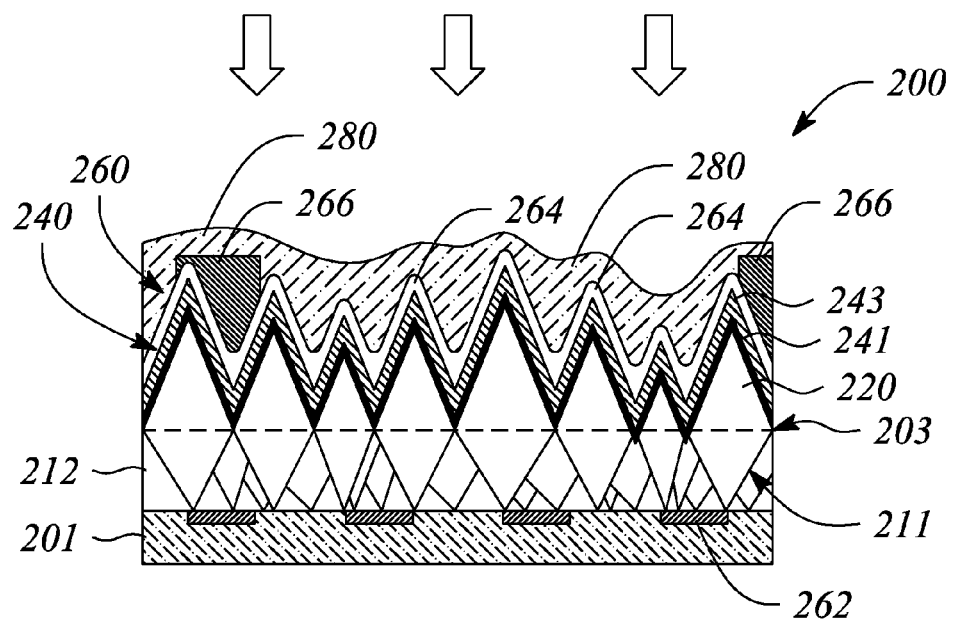
FIG. 2E illustrates a cross sectional view of the photonic device fabricated in accordance with the method of FIG. 1, according to an embodiment of the present invention.

In some embodiments, growing a conformal layer of a junction material to form 140 the conformal semiconductor junction comprises epitaxially growing a layer of an intrinsic semiconductor material on the surface of the tapered structures and further epitaxially growing a layer of the second extrinsic semiconductor material on the intrinsic semiconductor layer to form a p-i-n junction with the tapered structures. In other embodiments, the conformal layer(s) may be initially deposited as an amorphous phase, and then annealed by a furnace or a laser beam to respectively induce solid-phase or melt-phase crystallization seeded from the single-crystalline tapered structure. In some of the above embodiments, the annealing method does not elevate the temperature of the substrate above its damage threshold (e.g., 450° C. for glass), allowing the integration of these structures onto substrates with relatively low tolerance to thermal exposure, which may be defined as melting temperature, warping temperature, or glass transition temperatures. FIG. 2D illustrates a cross sectional view of a conformal p-i-n semiconductor junction 240 that conforms to the topography of the plurality of tapered structures 220 according to an embodiment of the present invention. The p-i-n semiconductor junction 240 illustrated in FIG. 2D is illustrated by way of example only. Alternatively, the semiconductor junction 240 may be a p-n junction or a Schottky junction, as discussed above.

The method 100 of making further comprises providing 160 a first electrode and a second electrode. The first electrode is defined as an electrode that electrically accesses the plurality of tapered structures from the first ends (i.e., the base) of the tapered structures. The first electrode is adjacent to the transition region and the substrate. The first electrode also may be referred to herein as a 'bottom electrode,' 'base electrode' or a 'substrate electrode' for simplicity of discussion only. The second electrode is defined as an electrode that electrically accesses the plurality of tapered structures from the second end of the plurality of tapered structures. The second electrode may be adjacent to the surface layer of the conformal semiconductor junction. The second electrode may be referred to herein as a 'top electrode' or 'conformal electrode' for simplicity of discussion only. In some embodiments of the photonic device comprising a Schottky junction, the metal layer of the Schottky junction also functions as the second electrode. In some embodiments, one or both of the first electrode and the second electrode is optically transparent, as defined above.

In some embodiments, the first electrode is provided 160 on the substrate prior to forming 110 a polycrystalline layer. In other embodiments, the first electrode is provided 160 on the substrate after the polycrystalline layer is formed 110. The first electrode may be a continuous layer or may be a plurality of spaced apart first electrode traces (i.e., electrical conduction paths) that may ultimately connect to a common bus, depending on the embodiment. In some embodiments, the first electrode is provided 160 on the substrate surface using any one or more of sputtering, evaporation, chemical vapor deposition, electrodeposition, electroless deposition and printing, for example. In other embodiments, the first electrode is embedded into the substrate surface, such as by using ion implantation to create heavily doped conductive regions in the surface. FIGS. 2A-2D illustrate a cross sectional view of a plurality of first electrode 262 traces spaced apart in a surface of the substrate 201 that is adjacent to the transition region 212 by way of example, according to an embodiment of the present invention. In some embodiments, the first electrode 262 traces electrically connect to a first common bus (not illustrated) adjacent to an end of the first electrode 262 traces. In other embodiments, the substrate 201 itself is also the first electrode 262 (not illustrated) and therefore, an additional electrode material layer for a first electrode is unnecessary.

The first electrode may be sandwiched between the substrate surface and the transition region of the polycrystalline layer and therefore, provided 160 before the polycrystalline layer is grown 110. In other embodiments (not illustrated), the first electrode may be otherwise directly adjacent to (i.e., in physical and electrical contact with) an edge or a side of the transition region and therefore, provided 160 either before or after the polycrystalline layer is grown 110. The first electrode may be any of the electrode materials described above. In some embodiments, the first electrode has very low resistivity to facilitate carrier extraction from the photonic device. In these embodiments, the first electrode is selected from the conductive metals provided above for the electrode materials. In some embodiments, providing 160 the first electrode further comprises providing the first common bus that electrically connects to the first electrode and is accessible from outside of the active region of the photonic device. The first common bus may be an electrically conductive metal also selected from the electrode metal materials provided above.

The second electrode is provided 160 on the surface layer of the conformal semiconductor junction that is formed 140 on the plurality of tapered structures. In some embodiments, providing 160 the second electrode comprises depositing a conformal layer of a second electrode material on the surface layer of the semiconductor junction. FIG. 2E illustrates a magnified cross sectional view of the photonic device 200 that includes a second electrode 260 adjacent to the conformal semiconductor junction 240 according to an embodiment of the present invention. In the embodiment illustrated in FIG. 2E, the second electrode 260 comprises a conformal layer 264 of the second electrode material directly on the surface of the extrinsic semiconductor layer 243 of the semiconductor junction 240. The extrinsic semiconductor layer 243 is directly on the intrinsic semiconductor layer 241 of the p-i-n semiconductor junction 240 in FIG. 2E. The conformal second electrode layer 264 may maintain an undulating surface of conformal semiconductor junction 240 on the plurality of tapered structures 220. In other embodiments (not illustrated), the second electrode may be provided by depositing a layer of a second electrode material that partially conforms to the undulating surface, instead of a conformal layer, such that the undulating surface is less prominent. The second electrode material of the conformal electrode layer 264 is electrically conductive and may provide optical transparency. Any of the electrode materials provided above may be used for the conformal second electrode layer 264. The second electrode 260 may be provided 160 using one or more of the deposition methods mentioned above that are compatible with the fabrication of the photonic device described herein.

In some embodiments, providing 160 the second electrode further comprises providing a plurality of spaced apart second electrode traces (conduction paths) on and electrically connected to the conformal second electrode layer. FIG. 2E further illustrates two spaced apart second electrode traces 266 of the plurality on the conformal second electrode layer 264 by way of example. The second electrode traces 266 are highly conductive electrode paths that extend across the photonic device 200 to facilitate carrier extraction from the conformal second electrode layer 264 out of the photonic device. In some embodiments, the second electrode traces 266 are narrow in width to reduce obstruction of the optical path (illustrated as large arrows in FIG. 2E) of the photonic device 200. In some embodiments, the second electrode traces 266 are thicker (taller in height) than the conformal second electrode layer 264 to facilitate reducing resistance of the second electrode 260.

The combination of a conformal second electrode layer 264 and a plurality of spaced apart second electrode traces 266 ultimately provide lower resistance paths for carrier extraction from the semiconductor junction 240 of the photonic device 200. Any of the materials provided above for the electrode materials may be used for the plurality of second electrode traces 266. In some embodiments, the second electrode traces 266 are an electrically conductive metal (i.e., metallic strips) or a highly doped semiconductor material. In some embodiments, the second electrode traces are also optically transparent. In some embodiments, the conformal layer 264 of the second electrode is an inherently optically transparent material (e.g., ITO) and the plurality of spaced apart second electrode traces 266 may be any of the electrode materials, for example.

The second electrode 260 electrically connects to a second common bus (not illustrated) that is outside of the optical path of the photonic device. In some embodiments, providing 160 the second electrode further comprises providing the second common bus outside of the optical path that electrically connects to the second electrode. The second common bus may be selected from the electrode materials provided above. For example, the second common bus may be any of the electrically conductive metals.

In some embodiments, the method 100 of making a photonic device further comprises applying a passivation layer to cover the second electrode and thus, protect the plurality of tapered structures and the conformal semiconductor junction. The passivation layer protects the underlying active region from dust, debris, moisture as well as other device degrading chemicals (e.g., oxygen), for example. In some embodiments, the passivation layer provides a hermetic seal to protect the photonic device from moisture. FIG. 2E further illustrates a passivation layer 280 adjacent to the second electrode 260 of the photonic device 200. The passivation layer 280 encapsulates the surfaces of the photonic device 200 according to an embodiment of the present invention. In some embodiments, the passivation layer further covers the second common bus (not illustrated). The passivation layer comprises an electrically insulating, optically transparent material including, but not limited to silicon nitride, silicon oxide and doped silicon oxide. In some embodiments, the passivation layer may further comprise antireflective characteristics.

In some embodiments, the method 100 of making a photonic device further comprises cleaning the surfaces of the plurality of tapered structures after preferentially etching 120 the columnar grain boundaries but before forming 140 a conformal semiconductor junction. Cleaning the surfaces comprises one or both of a chemical cleaning technique and a plasma cleaning technique to remove any residue and any surface damage caused by the preferential etching 120. Chemical cleaning depends on the materials to be cleaned. For example, for chemical cleaning of silicon, one or more of a solution of ammonium hydroxide:hydrogen peroxide ($NH_4OH:H_2O_2$), a solution of sulfuric acid:hydrogen peroxide ($H_2SO_4:H_2O_2$), and a solution of hydrochloric acid:hydrogen peroxide ($HCl:H_2O_2$) may be used. In some embodiments, chemical cleaning may further include a hydrofluoric acid (HF) etch of native oxides, for example. In some embodiments, plasma cleaning comprises using oxygen plasma or argon plasma, for example.

The photonic device 200 illustrated in FIG. 2E may be either a photodetector or a photovoltaic (solar) cell, depending on the embodiment. A plurality of the photonic devices 200 may be connected in one or both of series and parallel to form a solar array, for example. The photodetector may be used as an optical sensor. The photonic device fabricated on a large area substrate, according to some embodiments, provides a lower cost device with at least comparable energy conversion efficiency to some higher cost single crystal photonic devices. As such, some of the photonic device embodiments of the present invention may be used in applications not previously considered due to cost.

In some embodiments (not illustrated), the photonic device as described above may serve as a support or 'first device layer' for the fabrication of one or more other device layers stacked on top of the photonic device. The other device layers each comprises a plurality of tapered structures and a conformal semiconductor junction, as described above for the photonic device made by the method 100 of making a photonic device. One or both of the tapered structures and the conformal semiconductor junction of the other device layer(s) comprise different semiconductor materials from the first device layer.

In particular, before a passivation layer 280 is applied to the above-described photonic device 200, a conductive columnar polycrystalline layer may be formed over the second electrode layer 260 using deposition or crystallization of an amorphous precursor material. The material of the conductive columnar polycrystalline layer is different from the tapered structures in that it is optically transparent to at least some wavelengths of light that can be absorbed in the underlying first device layer of tapered structures. In some embodiments, the conductive columnar polycrystalline layer has a larger bandgap than the underlying semiconductor tapered structures of the first device layer. Then the newly formed columnar polycrystalline layer is processed into tapered structures and a conformal semiconductor junction (i.e., one or more of a p-n junction, a p-i-n junction, and a Schottky junction) is formed on the tapered structures, both of which being similar to that described above for the method 100 of making. This 'device layering' process using the method 100 of making a photonic device may be repeated several times, to yield multiple, stacked layers of tapered structures each comprising different materials and a conformal semiconductor junction. A device comprising multiple device layers of tapered structures as described herein is an embodiment of a multilayer heterojunction photonic device (e.g., a multilayer heterojunction photovoltaic device) that is designed to generate power from a greater region of the solar spectrum. In another embodiment, the tapered structures of the other device layer(s) may comprise tapered wire structures, such as those are obtained by catalyzed growth, as described below in later paragraphs.

Figure 3:
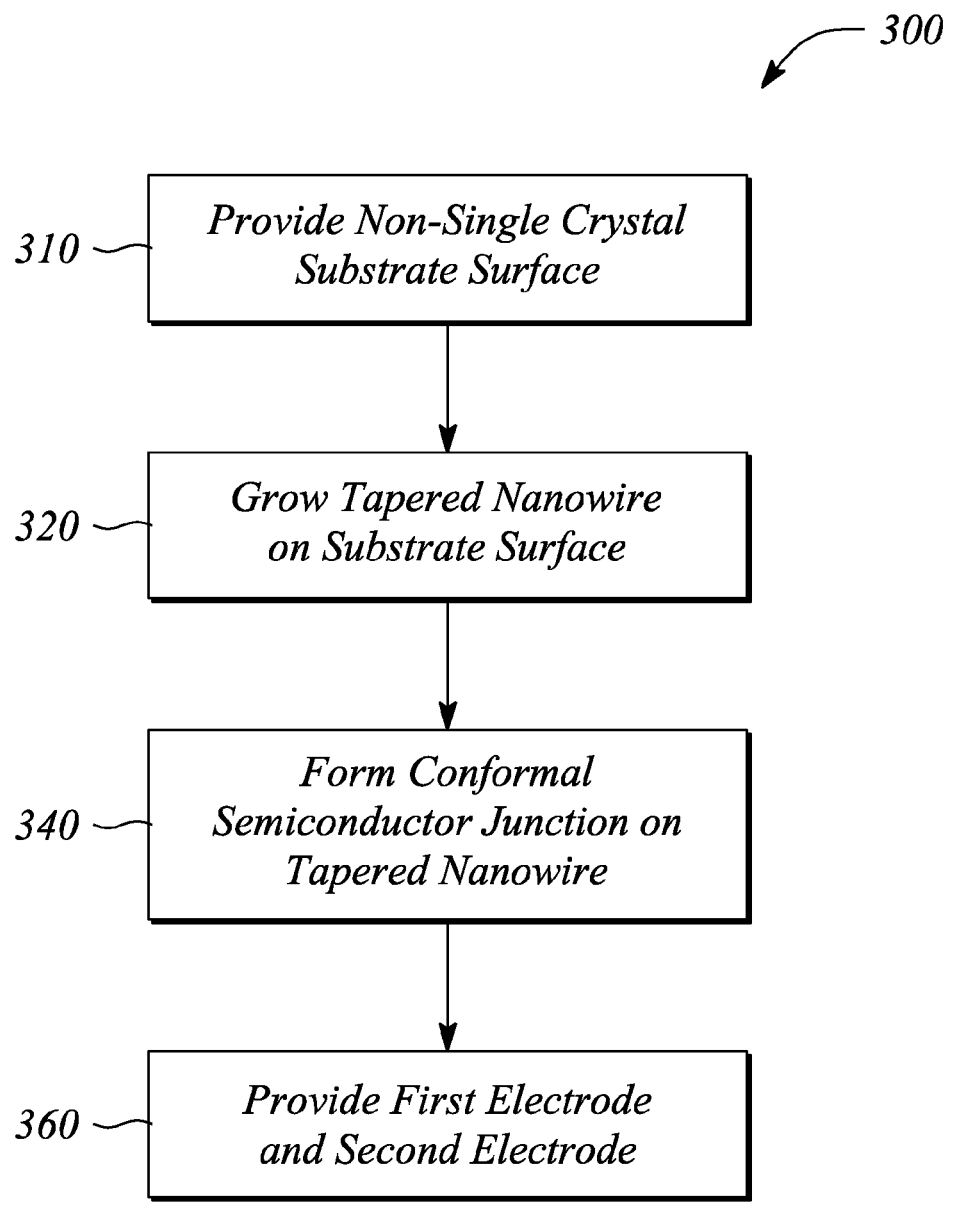
FIG. 3 illustrates a flow chart of a method of fabricating a photonic device, according to another embodiment of the present invention.

In another embodiment of the present invention, a method of fabricating a photonic device and a photonic device are provided. FIG. 3 illustrates a flow chart of a method 300 of making a photonic device according to an embodiment of the present invention. The photonic device is made with a plurality of tapered wires, as opposed to the tapered structures formed by various embodiments of the method 100 of making a photonic device that are described above. The method 300 of making a photonic device comprises providing 310 a non-single crystal surface to a substrate. In some embodiments, providing 310 a non-single crystal surface comprises using a substrate material that is non-single crystalline. In other embodiments, providing 310 a non-single crystal surface comprises depositing a non-single crystal seed layer on a substrate.

As used herein, a 'non-single crystal surface of a substrate' may be the surface of a semiconductor substrate that is any one of an amorphous semiconductor substrate, a microcrystalline semiconductor and a polycrystalline semiconductor substrate. In other embodiments, a 'non-single crystal surface of the substrate' may be a seed layer deposited on a substrate, wherein the seed layer is any one of an amorphous semiconductor seed layer, a microcrystalline semiconductor seed layer and a polycrystalline semiconductor seed layer and the substrate is any substrate material, such as a glass, a metal, a metal alloy, a ceramic, a plastic, a polymer, a dielectric and a semiconductor, which can withstand the processing temperatures and conditions of the combined growth method of making, as described herein.

For example, silicon may be deposited on a glass substrate as a polycrystalline silicon seed layer, a microcrystalline silicon seed layer or an amorphous silicon seed layer, depending on the deposition conditions. By definition, single crystal grains can be nucleated by homogeneous or heterogeneous nucleation on each of such 'polycrystalline' semiconductor material, 'microcrystalline' semiconductor material and 'amorphous' semiconductor material. In some embodiments, the grains (or crystallites) of a semiconductor seed layer may not exist initially, but develop via random nucleation during thermal processing involved with the tapered wire growth. For simplicity herein, a 'substrate surface' may mean either a surface of a substrate or a seed layer of a material on a surface of the substrate, depending on the embodiment of the present invention.

Herein, a 'seed layer' is defined as a non-single crystal semiconductor material which has a microstructure with an atomic ordering that is different from a single crystal. A 'single crystal' material has a crystal lattice microstructure with long-range atomic ordering that is continuous in at least micrometer scale. The atomic ordering of the seed layer may manifest itself as multiple, small grains or regions of crystalline material or 'crystallites' dispersed within and generally throughout the seed layer (e.g., 'short-range atomic ordering'), in some embodiments. The grains or crystallites provide a template for potential nucleation and growth of a single crystal wire structure. The regions of crystallites may range from large areas filled with crystallites to clusters of individual crystallites, or to discrete individual crystallites. In some embodiments, the seed layer comprises multiple crystallites, often buried in an amorphous matrix. In other embodiments, the seed layer consists of multiple adjacent crystallites (e.g., a polycrystalline material). Adjacent crystallites within the seed layer have respective lattices that are non-uniformly oriented with respect to one another. As used herein, the term 'crystallite' means a range of crystallites from a single crystallite to a group of crystallites aggregated together for the purposes of some embodiments.

As mentioned above, in some embodiments of the present invention, a crystallite of the non-single crystal surface of the substrate may provide a template for potential nucleation and epitaxial growth of a single crystal wire structure. As such, the wire structures also may be physically anchored to the crystallites in the surface of the non-single crystal substrate. The grown wire structure forms an interface (e.g., a homojunction or a heterojunction) with the crystallite where the wire structure is connected to the crystallite commensurately. As such, the wire structure is said to be 'integral to' a crystallite of the surface that nucleates the wire growth. In some embodiments, the crystal lattice of the single crystal wire structure and the crystal lattice of the crystallite of the non-single crystal substrate surface are coherent. The coherent lattices of the non-single crystal substrate surface and the single crystal wire structure facilitate charge carrier transport through the interface, for example. The integral crystal-structure connection at the interface between the non-single crystal substrate surface and the single crystal wire structure facilitates using the interface in semiconductor junction-related photonic device applications. Moreover, the non-uniform orientations of the crystallites in the non-single crystal substrate surface means that the anchored wire structures are concomitantly not uniformly aligned with respect to one another on the non-single crystal substrate surface in some embodiments.

In the method 100 of making a photonic device embodiments described above that employ a polycrystalline film 210 to form tapered structures 220, the transition region 212 of the polycrystalline film 210 may be considered a type of 'seed layer' in that the transition region 212 comprises a plurality of non-uniformly oriented small grains (i.e., seeds) that, during growth of the polycrystalline layer, only some of the grains 213 continue to grow in size to form the columnar region 214 of much larger, uniformly oriented grains 217.

The method 300 of making further comprises growing 320 single crystal tapered wires on the provided 310 non-single crystal substrate surface. Growing 320 tapered wires comprises a combination of metal-catalyzed growth and non-catalyzed growth. For example, metal-catalyzed growth includes, but is not limited to, using one of a vapor-liquid-solid (VLS) technique and a vapor-solid-solid (VSS) technique and a nanoparticle catalyst comprising a metal. Non-catalyzed growth includes, but is not limited to, selective-area vapor phase epitaxy. In some embodiments, nanoparticle catalysts are formed on the non-single crystal surface of the substrate using one or more techniques including, but not limited to, sputtering, electron-beam evaporation, thermal evaporation, electrochemical deposition, deposition of pre-formed nanoparticles, and chemical vapor deposition, which deposits catalyst material on the surface. In some embodiments, selectively forming a nanoparticle catalyst further includes annealing the deposited catalyst material.

Typical metal catalyst materials include, but are not limited to, gold (Au), titanium (Ti), platinum (Pt), nickel (Ni), aluminum (Al), tungsten (W), gallium (Ga), and alloys thereof. Typical nanoparticle catalysts corresponding to Ti and Au catalyst materials used with a silicon non-single crystal surface, for example, are respectively $TiSi_2$ and Au—Si alloy. In some embodiments, the nanoparticle catalyst is randomly located on the non-single crystal surface of the substrate.

Single crystal wire growth 320 is initiated from a location on the non-single crystal surface where the nanoparticle catalyst was formed or deposited on the non-single crystal surface. As such, the location from which wire growth is initiated may be non-uniformly located across the non-single crystal surface of the substrate. The single crystal wire will grow 320 in place anchored to a crystallite (when present) in the non-single crystal surface from the location of the nanoparticle catalyst and may grow in a direction dictated by the orientation of the crystallite. In some growth mechanisms, the nanoparticle catalyst remains on the free end of the wire during and after growth 320. For example, the substrate with the nanoparticle catalysts on its surface is placed in a chemical vapor deposition (CVD) chamber with a controlled environment. One or more of a variety of parameters are manipulated in the controlled environment of the CVD chamber during growth 320 that provides a variety of tapered shapes to the wire structure. Parameters including, but not limited to, temperature, pressure, flow rate of gases, partial pressure of precursor gases, mixture of gases, and any combination of these parameters may be manipulated to vary the shape of the growing wire.

Within a first temperature range, wire growth may be mostly catalytic growth in an axial direction adjacent to the nanoparticle catalyst (i.e., new growth). Within a second temperature range that is higher than the first temperature range, non-catalyzed epitaxial growth starts and such non-catalyzed growth direction is radially (or laterally) from a part of the wire that has already grown (i.e., existing wire structure) while new wire growth (catalyzed) continues adjacent to the nanoparticle catalyst. As such, the radial growth on the existing wire structure provides a wider base end than top end of the wire. Both the catalytic growth rate and the non-catalytic growth rate are both affected by the temperature; for example at the higher second temperature, the ratio of catalytic growth to non-catalytic growth may be less than at the first temperature. Within a third temperature range which is even higher than the second temperature, the base of the wire becomes even wider due to an even lower ratio of catalytic growth to non-catalytic growth, and depending on the temperature, the ratio of catalytic growth to non-catalytic growth may come to parity, for example.

In effect, a first end of the initiated growing wire (i.e., the base end), which is adjacent to the substrate surface, accrues more wire material during wire growth with time than does the second or opposite end of the initiated growing wire, which is adjacent to the nanoparticle catalyst, because the first end of the wire is exposed to the wire precursor material in the gas mixture longer than the second end during non-catalytic growth. Thus, a wire structure with a tapered shape results. In some embodiments, wire growth 320 may be both catalyzed and non-catalyzed in a ratio to provide a constant taper angle from base to top of the wire using an intermediate temperature or temperature range, for example. Slight adjustments to the intermediate temperature in the range up or down with time will correspondingly affect the shape of the wire. For example, changes in taper angle may be achieved using slight adjustments to the intermediate temperature for periods of time during growth 320.

Figure 4A:
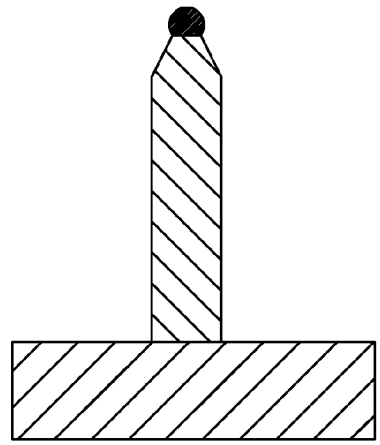
FIGS. 4A-4D illustrate cross sectional views of various tapered wire structures grown in accordance with the method of FIG. 3, according to another embodiment of the present invention.
Figure 4B:
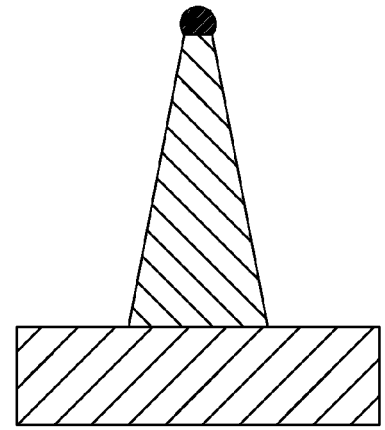

FIGS. 4A-4D illustrate cross sectional views of tapered wires that may be grown 320 in accordance with the method 300 of making that is illustrated in FIG. 3, according to an embodiment of the present invention. Referring to FIG. 4A, the shape of the tapered wire represents a high ratio of catalytic growth to non-catalytic growth in a first temperature range. In other words, longitudinal or axial catalyzed growth dominates in the first temperature range; for example between about 320° C. and about 360° C. for germanium wires. Moreover, other parameters affect the shape of the nanowire as well including, but not limited to the chemistry (gases used), pressures and flow rates, as mentioned above. However, for simplicity of discussion here, temperature is highlighted by way of example. FIG. 4B illustrates an example of a tapered wire (e.g., a cone) that represents a slightly lower ratio of catalytic growth to non-catalytic growth at an intermediate temperature range where the intermediate temperature range is higher than the first temperature range in FIG. 4A. In other words, the axial catalyzed growth competes with uniform lateral epitaxial (non-catalyzed) growth at the intermediate temperature range, for example between about 360° C. and about 400° C. for germanium wires.

Figure 4C:
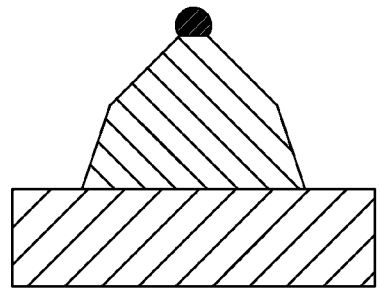

FIG. 4C illustrates an example of a tapered wire that represents the ratio of catalytic growth to non-catalytic growth approaching parity at a relatively higher third temperature. In other words, growth in the axial (catalyzed growth) direction and lateral (non-catalyzed growth) direction occurs at a commensurate rate, resulting in a tapered wire with a small aspect ratio; and in some instances, growth angles characteristic of epitaxial growth are observed. This is because uniform lateral epitaxial (non-catalyzed) growth dominates at such higher temperatures, for example greater than 400° C. for germanium wires.

Figure 4D:
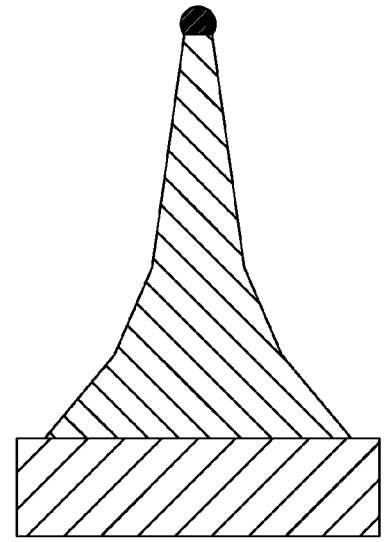

FIG. 4D illustrates an example of tapered wire that is grown by starting with a higher temperature and gradually decreasing the temperature, for example, a starting temperature at about 400° C. that is decreased to about 370° C., for germanium wires. The temperature is decreased either in a continuous manner to obtain a constant rate of reduction in taper angle (i.e., a continuously varying taper angle) or in incremental steps for periods of time to obtain a series of different taper angles. In contrast, a constant temperature is used to obtain a single taper angle. At the start, the ratio of catalytic growth to non-catalytic growth is low in that lateral epitaxial growth (non-catalytic deposition) dominates; and during the lower temperature portions of the growth process, the ratio of catalytic growth to non-catalytic growth increases in that the lateral non-catalyzed growth rate decreases more rapidly than does the axial catalyzed growth rate. The tapered wire in FIG. 4D is one example of an incremental decrease of the temperature to create one or more taper angles along the axial length of the tapered wire. The growth temperatures for other semiconductor materials may be different from those described above for germanium wires, as well as other parameters not described above, such as different precursor gases, different pressures and gas flow rates, for example.

In another example, the gas mixture introduced in the CVD reaction chamber may be manipulated to provide a variety of tapered shapes to the wire structure. For example, a ratio of precursor gases to regulating gases in the gas mixture may be varied during wire growth 320. Such variations may change a degree of taper, for example, such that the wire structure can have a variable angle of taper along the axial length thereof, for example. The regulating gas regulates the non-catalyzed deposition rate of the wire material on the grown portion of the growing wire structure. In some embodiments, the regulating gas reduces the angle of taper by reducing the non-catalyzed deposition rate while the axial growth rate (i.e., catalyzed growth) may be less significantly decreased. As such, it is within the scope of the present invention to have embodiments wherein one or both of temperature and the ratio of gases in the gas mixture is manipulated during wire growth to achieve a wire shape having other than a constant angle of taper.

After the growth 320 process is completed, a plurality of tapered wires is anchored to the non-single crystal substrate surface in a disorganized array, according to some embodiments. For example, the tapered wires are non-uniformly located on the substrate surface and the tapered wires are non-uniformly aligned with respect to one another on the substrate surface due to the non-single crystal surface of the substrate.

The method 300 of making further comprises forming 340 a conformal semiconductor junction on the tapered wires. Forming 340 a conformal semiconductor junction comprises depositing a layer of a junction material on the tapered wire to thoroughly (i.e., conformally) coat the tapered wire. In some embodiments, the conformal layer of a junction material may be an epitaxial layer of the nanowire semiconductor material. In other embodiments, the conformal layer of junction material may be an epitaxial layer of another semiconductor material or a metal. In some embodiments, the conformal layer of junction material may be deposited non-catalytically using a CVD chamber, for example using the same CVD chamber used to grow 320 the tapered wire. The conformal layer may be grown using different deposition conditions for example, the conformal layer may be grown at a higher temperature than used for growing 320 the tapered wire.

Depending on the embodiment, the nanoparticle catalyst may be left on the top of the tapered wires or removed from the tapered wires either before or after the conformal semiconductor junction is formed. In some embodiments, forming 340 a conformal semiconductor junction is similar to forming 140 a conformal semiconductor junction according to any of the embodiments described above for the method 100 of making a photonic device. As such, the conformal semiconductor junction may be one or more of a p-n junction, a p-i-n junction and a Schottky junction. Moreover, any of the semiconductor materials described above for the semiconductor junction, as well as any of the metals described above for a Schottky junction, may be used for forming 340 a conformal semiconductor junction according to the method 300 of making a photonic device.

The method 300 of making further comprises providing 360 a first electrode and a second electrode. The first electrode is in electrical contact with the non-single crystal substrate surface and therefore, the base end of the tapered wires. The first electrode facilitates carrier extraction out of the photonic device from the base end. The first electrode may be provided 360 adjacent to the non-single crystal substrate surface either before or after growing 320 tapered wires, depending on the embodiment.

The second electrode is in physical contact with the surface of the semiconductor junction and therefore, in contact with the top end of the tapered wires. The second electrode facilitates carrier extraction out of the photonic device from the top end. The second electrode is provided 360 as a layer of an electrode material on the plurality of tapered wires. In some embodiments, the second electrode layer is a relatively thin but continuous layer over the disorganized plurality of tapered wires in an effort to make physical contact with as many of the tapered wires as possible. In some embodiments, the second electrode further comprises a plurality of spaced apart second electrode traces in physical and electrical contact with the second electrode layer. In some embodiments, the first and second electrodes and the electrode materials used are similar to any of the embodiments described above for providing 160 the first electrode 262 and the second electrode 260 in the method 100 of making a photonic device 200.

In some embodiments, the method 300 of making further comprises applying a passivation layer to cover the second electrode and thus, protect the plurality of tapered wires with their conformal semiconductor junctions. The passivation layer protects the underlying active region from dust and debris, and degrading chemicals (e.g. oxygen), as well as moisture, for example. In some embodiments, the passivation layer provides a hermetic seal to protect the photonic device from moisture. In some embodiments, the passivation layer and materials used are similar to any of the embodiments described above for the passivation layer in the method 100 of making a photonic device. A photonic device made by the method 300 of making is not illustrated herein.

Thus, there have been described embodiments of a method of fabricating a photonic device and a photonic device that employ a light-absorbing semiconductor material with a high degree of crystallinity that can be fabricated on large area substrates. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method (100) of making a photonic device (200) comprising:
    growing (110) a polycrystalline layer (210) of a semiconductor material on a substrate (201), the polycrystalline layer (210) comprising a transition region (212) of variously oriented small grains adjacent to the substrate (201) and a region (214) of relatively larger grains delineated by columnar grain boundaries (215) adjacent to the transition region (212);
    preferentially etching (120) the columnar grain boundaries (215) to the transition region (212) to provide tapered structures (220) of the semiconductor material that are continuous (217) with respective aligned grains (213) of the transition region (212), the tapered structures (212) being predominantly single crystal;
    forming (140) a conformal semiconductor junction (240) on the tapered structures (220); and
    providing (160) a first electrode (201, 262) adjacent to the transition region (212) and a second electrode (260) adjacent to a surface layer of the conformal semiconductor junction (240).

2. The method (100) of making of claim 1, wherein forming (140) a conformal semiconductor junction (240) comprises depositing a first semiconductor layer on the tapered structures (220) to conform to a topography of the plurality of tapered structures (220), and depositing a conformal layer of junction material on the first semiconductor layer, a depletion region of the conformal semiconductor junction (240) being spaced from the plurality of tapered structures (220) by the first semiconductor layer.

3. The method (100) of making of claim 2, wherein the conformal layer of junction material comprises either a metal or a semiconductor material, the conformal layer of junction material respectively forming either a Schottky junction (240) or a p-n junction (240) with the first semiconductor layer.

4. The method (100) of making of claim 2, wherein depositing a conformal layer of junction material on the first semiconductor layer comprises:
depositing an intrinsic semiconductor conformal layer (241) adjacent to the first semiconductor layer; and
depositing a second semiconductor conformal layer (243) adjacent to the intrinsic semiconductor conformal layer (241), the first semiconductor layer comprising a first dopant type, the second semiconductor conformal layer (243) comprising a second dopant type, the second dopant type being reverse of the first dopant type to form a p-i-n junction (240) with the first semiconductor layer.

5. The method (100) of making of claim 1, wherein forming (140) a conformal semiconductor junction (240) comprises depositing a layer of metal on the tapered structures (220) to conform to a topography of the plurality of tapered structures (220), the metal layer forming a conformal Schottky junction (240) with the plurality of tapered structures (220).

6. The method (100) of making of claim 1, wherein forming (140) a conformal semiconductor junction (240) comprises epitaxially growing a layer (241, 243) of semiconductor material on the plurality of tapered structures (220), the tapered structures (220) and the transition region (212) comprising a first dopant type, the semiconductor material layer (241, 243) comprising an extrinsic region (243) of a second dopant type that is opposite the first dopant type, the layer of semiconductor material forming either a conformal p-n junction (240) or a conformal p-i-n junction (240) with the plurality of tapered structures (220).

7. The method (100) of making of claim 1, wherein preferentially etching (120) the columnar grain boundaries (215) comprises etching a columnar grain boundary (215) into a portion (216) of the transition region (212), and wherein the conformal semiconductor junction (240) comprises a semiconductor conformal layer adjacent to the tapered structures (220) to space a depletion region of the conformal semiconductor junction (240) from grain boundaries (211) in the portion (216) of the transition region (212), the conformal semiconductor junction (240) further comprising a conformal layer of junction material on the semiconductor conformal layer, the junction material being either a metal or a semiconductor.

8. The method (100) of making of claim 1, wherein the substrate (201) is also the provided first electrode (201, 262).

9. The method (100) of making of claim 1, wherein the second electrode (260) comprises a conformal layer (264) of an optically transparent electrode material on a surface layer of the conformal semiconductor junction (240) and a plurality of conductive metal strips (266), the conductive metal strips (266) being spaced apart on the conformal layer (264) of the optically transparent electrode material, the plurality of conductive metal strips (266) being connected to a common bus.

10. The method (100) of making of claim 1, wherein the tapered structures (220) are single crystal, the substrate (201) being a large area amorphous substrate.

11. A photonic device (200) comprising:
a polycrystalline transition layer (212) on a substrate (201), the polycrystalline transition layer (212) being a small-grained semiconductor material having a variety of grain orientations;
a plurality of tapered structures (220), the tapered structures (220) being continuous (217) with respective aligned grains (213) of the polycrystalline transition layer (212), the tapered structures (212) being relatively larger-grained and predominantly single crystal;
a conformal semiconductor junction (240) on the plurality of tapered structures (220);
a first electrode (201, 262) adjacent to the polycrystalline transition layer (212); and
a second electrode (260) adjacent to a surface layer of the conformal semiconductor junction (240).

12. The photonic device (200) of claim 11, wherein the substrate (201) is a large area substrate that is one or both of amorphous and optically transparent, one or both of the first electrode (201, 262) and the second electrode (260) being optically transparent, and wherein the photonic device (200) is either a photovoltaic cell or a photodetector.

13. The photonic device (200) of claim 11, wherein the conformal semiconductor junction (240) comprises a semiconductor conformal layer on the tapered structures (220) and a conformal layer of a junction material (241, 243) on the semiconductor conformal layer, a depletion region of the conformal semiconductor junction (240) being spaced from the plurality of tapered structures (240).

14. The photonic device (200) of claim 11, further comprising a device layer on the second electrode (260), the device layer comprising a second plurality of tapered structures and a conformal semiconductor junction on the second plurality of tapered structures, wherein a semiconductor material of the device layer is different from a semiconductor material of the first-mentioned plurality of tapered structures (220), the photonic device (200) being a multilayer heterojunction photovoltaic device.

15. A photovoltaic cell (200) comprising:
a polycrystalline transition layer (212) on a large area substrate (201), the polycrystalline transition layer (212) being a small-grained semiconductor material having a variety of grain orientations;
a plurality of tapered structures (220), the tapered structures (220) being continuous (217) with respective aligned grains (213) of the polycrystalline transition layer (212), the tapered structures (220) being relatively larger-grained and predominantly single crystal;
a conformal semiconductor junction (240) on the plurality of tapered structures (220);
a first electrode (201, 262) adjacent to the polycrystalline transition layer (212);
a second electrode (260) comprising a conformal layer (264) of an optically transparent electrode material on a surface layer of the conformal semiconductor junction (240); and
a passivation layer (280) adjacent to the second electrode (260) that protects the photovoltaic cell (200).

* * * * *